United States Patent
Mahgerefteh et al.

Patent Number: 6,046,841
Date of Patent: Apr. 4, 2000

[54] ALL-OPTICAL WAVELENGTH CONVERSION SYSTEM COMPRISING AN OPTICAL DISCRIMINATOR

[76] Inventors: Daniel Mahgerefteh, 3005 Porterst NW., Washington, D.C. 20008; Pak Shing Cho, 24 Spring St., Gaithersburg, Md. 20877

[21] Appl. No.: 09/066,744

[22] Filed: Apr. 24, 1998

[51] Int. Cl.⁷ ........................................... G02F 1/35
[52] U.S. Cl. ............................... 359/326; 359/332
[58] Field of Search ..................... 359/326–332

[56] References Cited

U.S. PATENT DOCUMENTS

| | | | |
|---|---|---|---|
| 5,134,622 | 7/1992 | Deacon | 359/326 X |
| 5,781,334 | 7/1998 | Daendliker et al. | 359/326 |
| 5,946,129 | 8/1999 | Xu et al. | 359/332 |

*Primary Examiner*—John D. Lee

[57] ABSTRACT

The optical signal produced by a semiconductor-optical-amplifier based wavelength converter is passed through an optical discriminator. The resulting signal has improved extinction ratio for return-to-zero data and improved high-frequency response for both non-return-to-zero and return-to-zero data.

23 Claims, 15 Drawing Sheets

ALL-OPTICAL WAVELENGTH CONVERSION SYSTEM COMPRISING AN OPTICAL DISCRIMINATOR

BACKGROUND OF THE INVENTION

Semiconductor optical amplifiers (SOAs) are forward-biased diodes that provide optical amplification or gain for an input optical signal through stimulated emission, a process fundamental to the operation of lasers. Amplification is achieved by injecting electrical current or carriers (electrons and holes) into the SOA's active region. Carrier injection creates a population inversion between the conduction and valence bands which causes the input signal's intensity to increase as it passes through the SOA. Amplification occurs for a range of wavelengths near the band gap of the semiconductor.

Semiconductor optical amplifiers can also be used as all-optical wavelength converters for broadband wavelength-division-multiplexing networks as described by Yoo in *J. of Lightwave Technology*, vol. 14, p. 995 (1996). A wavelength converter device is an optical modulator that transfers the intensity modulation from one optical wavelength to a CW optical signal at a different wavelength. The optical digital signals commonly used are either non-return-to-zero (NRZ) where the intensity does not go to zero between continuous 1 bits and return-to-zero (RZ) where intensity does go to zero between continuous is as shown in FIGS. 1 and 2.

All-optical wavelength conversion is achieved either by cross-gain modulation in a single amplifier or by cross-phase modulation in one or two amplifiers integrated in an interferometer as explained in T. Durhuus et al., *J. Lightwave Technology*, vol. 14, p. 942 (1996). In the cross-gain-modulation technique, shown schematically in FIG. 3 for NRZ data, optical data at wavelength $\lambda_1$ and a CW optical signal at wavelength $\lambda_2$ enter a semiconductor optical amplifier 21. A band-pass optical filter 22 passes only $\lambda_2$ at the output. The output is transmitted through a length of optical fiber 23 and detected by a receiver 24. The data signal modulates the gain of the amplifier as it is reducing the population inversion by stimulated emission during the 1 bits. This modulates the CW signal, producing a logically inverted copy of the data; A 1 bit for $\lambda_1$ means lower gain for $\lambda_2$, hence a 0 at $\lambda_2$ and vice-versa. The inversion is one disadvantage of this method. Also when applied to RZ data, this scheme requires a train of pulses instead of the CW input, which requires an additional clock pulse source 25 as shown in FIG. 4.

In one of the cross-phase modulation schemes, shown in FIG. 5 two SOAs 26 and 26' are integrated into the arms of a Mach-Zehnder interferometer 27, forming an optical modulator. The band-pass filter 22 passes only $\lambda_2$ at the output. The interferometer is adjusted as to have a null output with no data input. The data pulses modulate the refractive index of the SOA in one arm by modulating its gain. The interferometer is now unbalanced and gives an output at $\lambda_2$ duplicating the intensity modulation of the data at $\lambda_1$. As compared with cross-gain modulation, this device, and other interferometer versions of it, have the advantage of a higher extinction ratio (ratio of 1s to 0s) and non-inverting outputs. Also, when applied to RZ data, clock pulses are not required; a CW signal at $\lambda_2$ is sufficient.

The finite gain recovery time of the SOA ultimately limits the modulation speed of both schemes for wavelength conversion. A characteristic roll-off frequency for optical modulation transfer function of the devices can be determined as described by T. Durhuus et al., *J. Lightwave Technology*, vol. 14, p. 942 (1996). At bit rates higher than the roll-off frequency, the converted output signal at $\lambda_2$ is distorted; the intensity of the 1 bits varying depending on the bit pattern that preceded them. The roll-off frequency can be increased somewhat by amplifier design, increased amplifier length, and higher optical powers. Also cascading two amplifiers as described by S. L, Danielsen, et al., *Electron. Lett.*, vol. 32, pp. 1688–1690, (1996) has achieved operation at 40 Gb/s.

However, this comes at great cost and requires specially designed amplifiers. For photonic integration of SOA wavelength converters with other passive and active components, the high modulation speed of the SOA has to be compromised to facilitate the fabrication process. This reduces the frequency roll-off of the wavelength converter, as for example in the device reported by L. H. Spiekman et al. *IEEE Photons. Technol. Lett.*, vol. 9, pp. 1349–1351 (1997). Also with present devices there is no simple way for upgrading the device's operation speed significantly without replacing it with a new device with higher frequency roll-off.

Another technique applicable to return-to-zero (RZ) data for wavelength conversion in a semiconductor optical amplifier is described by D. M. Patrick and R. J. Manning in *Electron. Lett.* vol. 30, pp. 252–253 (1993). Optical data of RZ, format at $\lambda_1$ and a CW signal at $\lambda_2$ co-propagate in the SOA. A birefringent filter is used to separate the spectrally shifted components of the CW signal and produce pulses at $\lambda_2$. This discriminator has two major drawbacks. It is sensitive to the polarization of signal at $\lambda_2$, requiring adjustments by polarization controllers which would also have to be stabilized. The transmission of a birefringent filter is limited to being sinusoidal, which is the not ideal filter function for digital applications Also because of the sinusoidal response, the steepness of the filter is tied to its bandwidth. Furthermore the birefringent filter includes 100 m of birefringent fiber, two polarization controllers and two free-space optical polarizers, which makes the filter bulky and lossy.

SUMMARY OF THE INVENTION

This invention increases the modulation frequency response of semiconductor optical amplifier wavelength converters for NRZ data and improves the extinction ratio as well as the high-frequency response for RZ data. The invention comprises an optical discriminator with steep slope such as a fiber Bragg grating filter placed after the semiconductor device. When the modulated signals produced by the semiconductor optical device is passed through the fiber grating, the output shows improved response.

Specifically, one object of the present invention is to increase the modulation response frequency of a semiconductor optical amplifier (SOA) wavelength converter for non-return-to-zero (NRZ) data. According to one aspect of the present invention shown in FIG. 6, the wavelength converted signal at the output of the SOA 21 is passed through an optical discriminator 28 such that the spectrum of the data 29 lies within the transition region of the discrminator's transmission spectrum 30 (FIG. 7).

Another object of this invention is to increase the frequency response of SOA wavelength converter as well as its extinction ratio for return-to-zero (RZ) data. According to another aspect of this invention shown in FIG. 8, the converted data is passed through the fiber Bragg grating discriminator with negative slope 28 such that the CW component 31 of the data lies near the zero transmission region of the fiber grating's transmission spectrum 32 (FIG. 9), while the red-shifted 33 components lie in the transition region. In another configuration with a fiber Bragg grating discriminator with positive slope, the blue-shifted components lie in the transition region, while the CW component of the data lies near the zero transmission region of the fiber grating's transmission spectrum.

DETAILED DESCRIPTION OF THE PREFERRED EMBODIMENT

Figure 1:
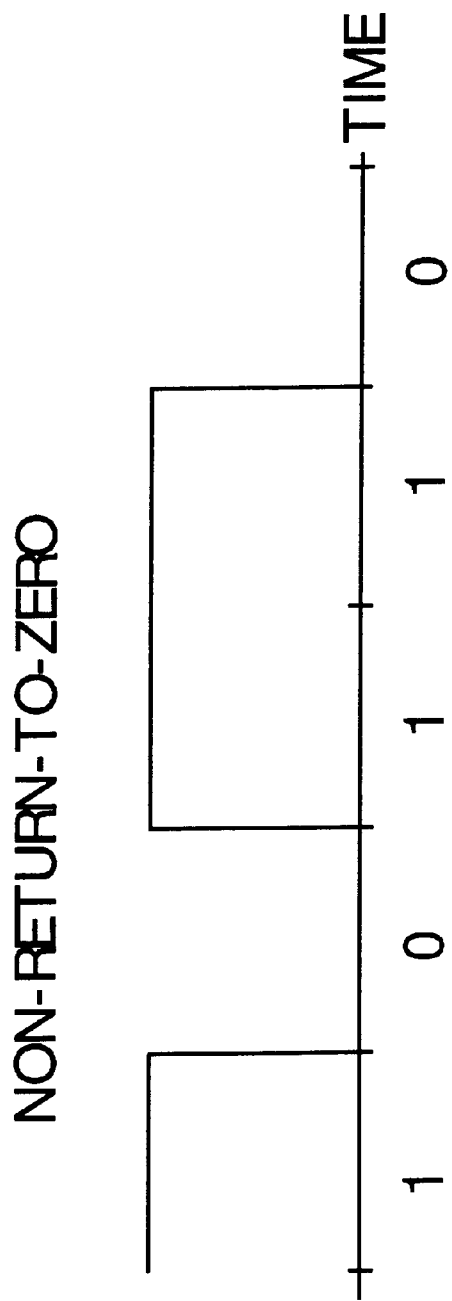
FIG. 1 Graphical representation of non-return-to-zero (NRZ) data.
Figure 2:
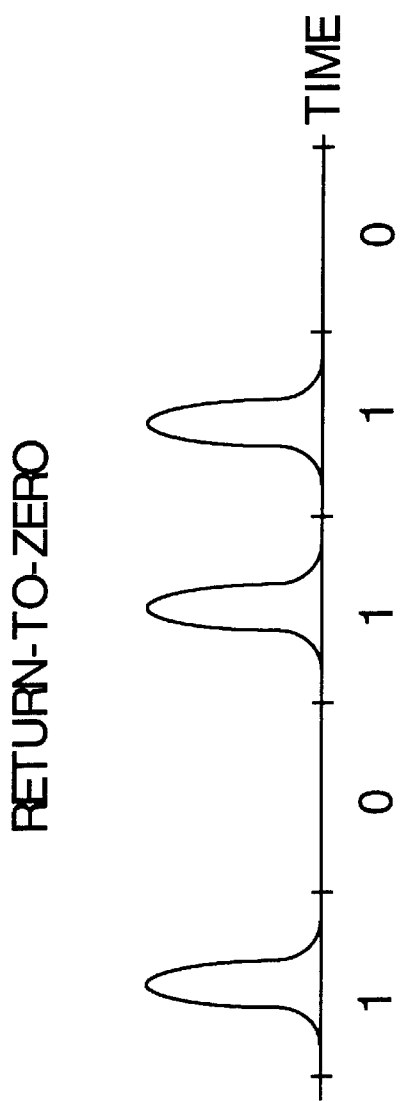
FIG. 2 Graphical representation of return-to-zero (RZ) data.
Figure 3:
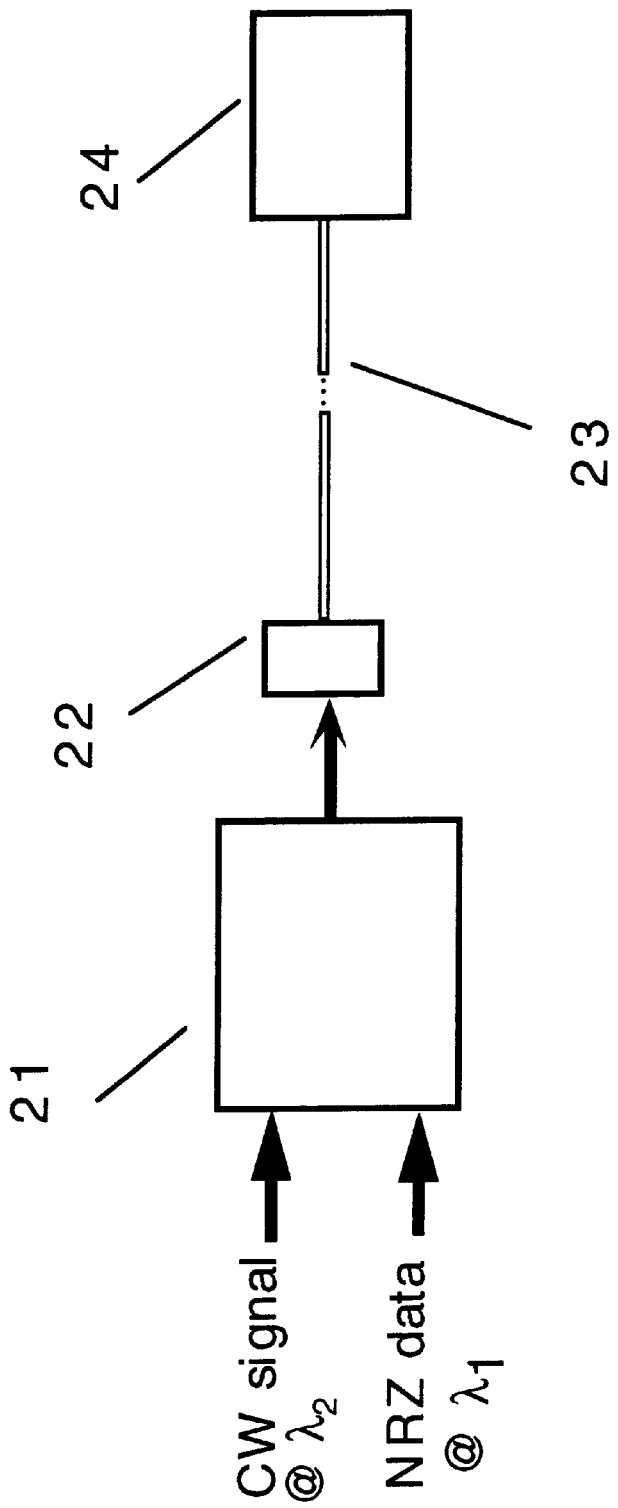
FIG. 3 Conventional optical wavelength converter for NRZ data.
Figure 4:
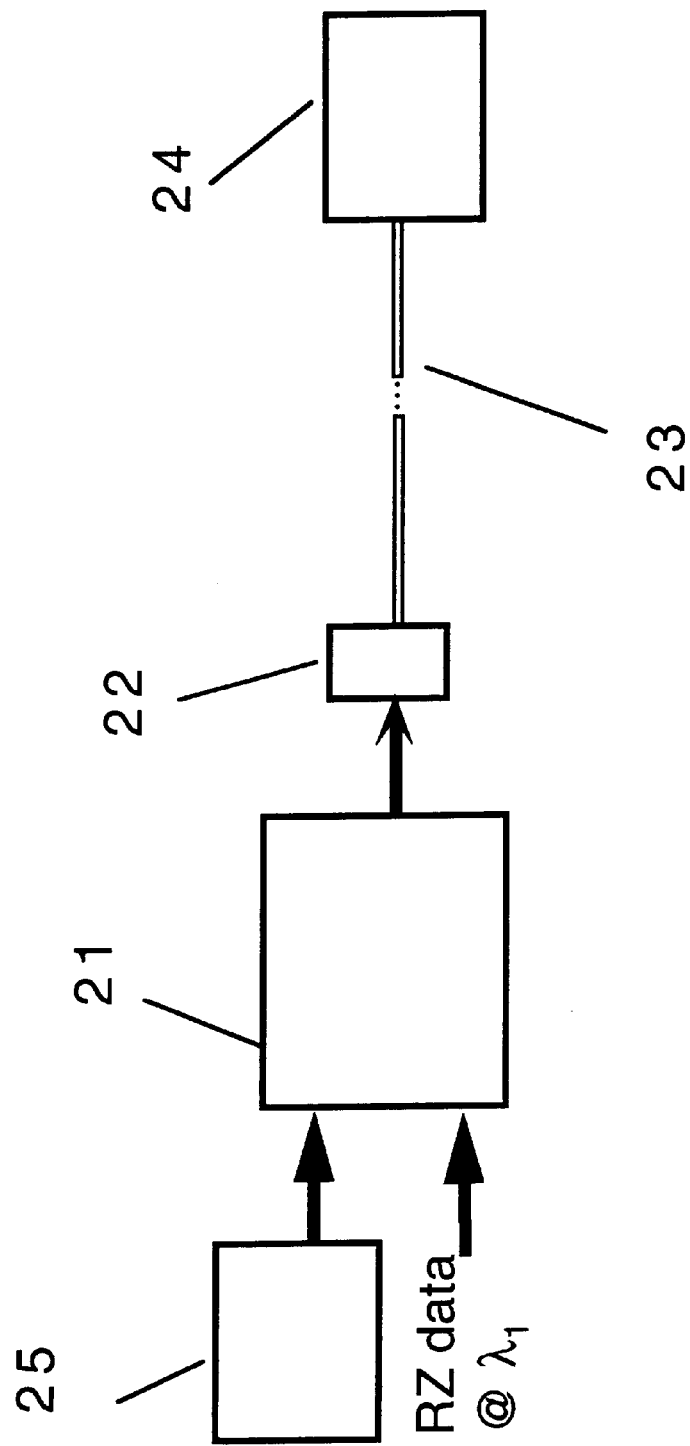
FIG. 4 Conventional optical wavelength converter for RZ data.
Figure 5:
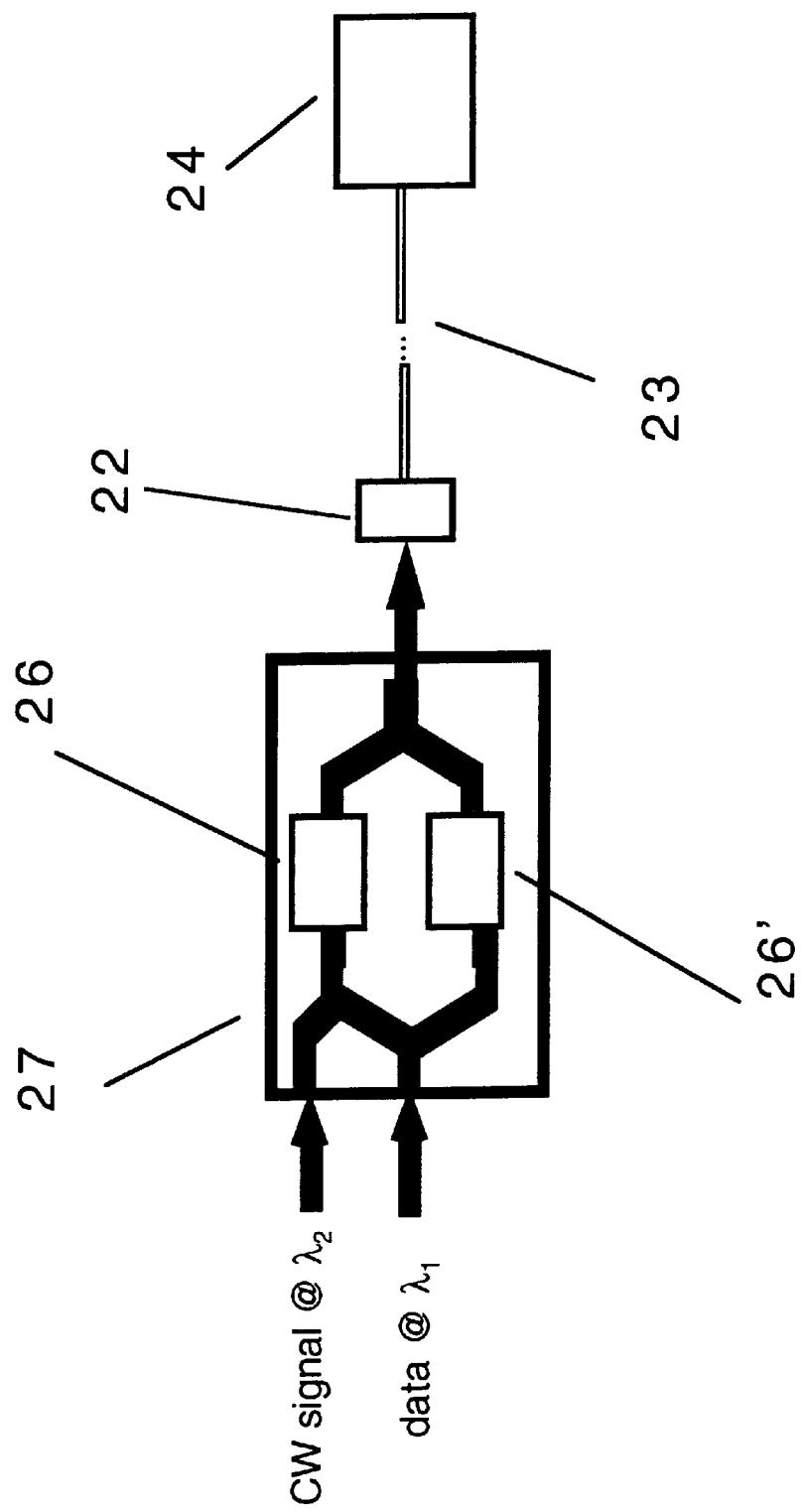
FIG. 5 Conventional Mach-Zehnder interferometer wavelength converter.
Figure 6:
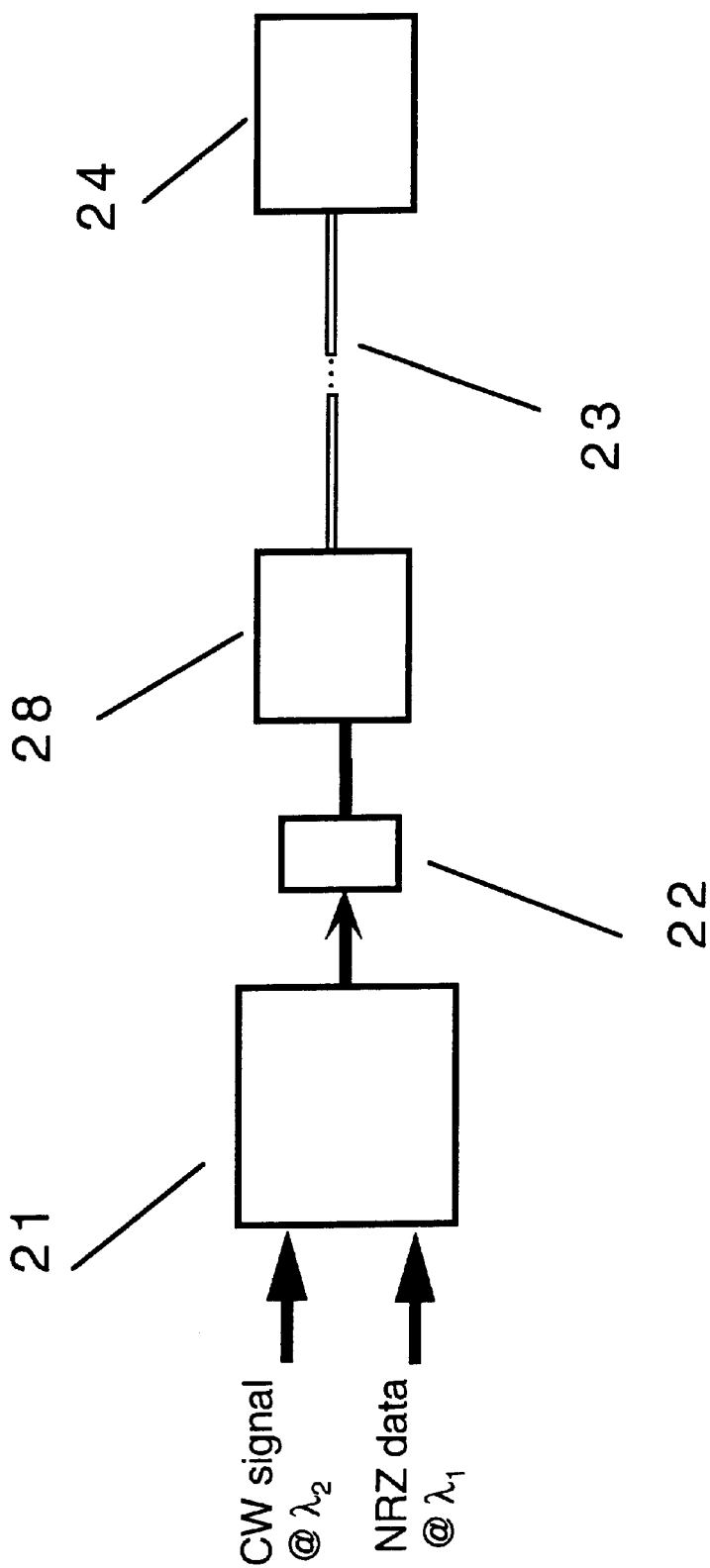
FIG. 6 Optical wavelength conversion system for NRZ data comprising optical discriminator.

For reasons mentioned in the background section, an objective of this invention is to increase the modulation response frequency of semiconductor-optical amplifier (SOA) wavelength converters for non-return-to-zero (NRZ) data format. As shown in FIG. 6 our invention is to combine the NRZ data at $\lambda_1$ and a CW signal at $\lambda_2$ in a SOA after which signal $\lambda_2$ at the output of the SOA 21 is passed through an optical discriminator 28.

Figure 10:
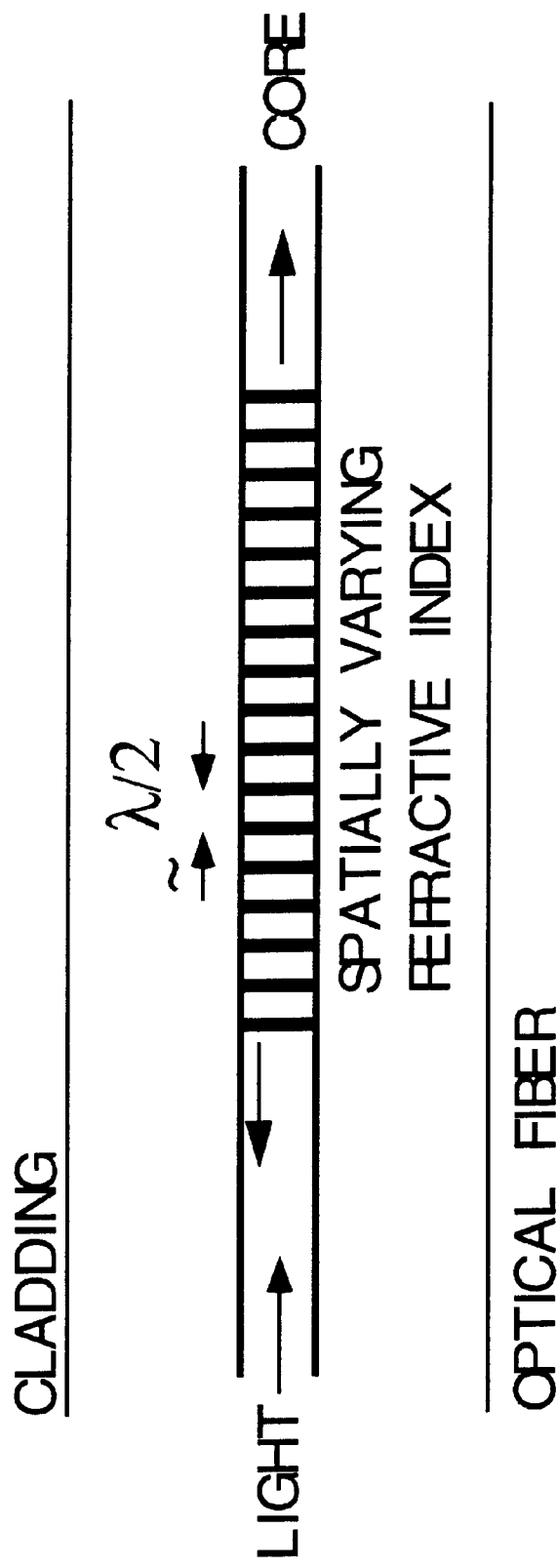
FIG. 10 Fiber Bragg grating optical discriminator.

A fiber Bragg grating is the preferred optical discriminator for this invention. As shown schematically in FIG. 10, the fiber Bragg grating is a spatially varying refractive index modulation along the propagation direction in an optical fiber. The index variation, is produced by exposing a bare optical fiber to a spatially varying intensity pattern at ultraviolet wavelength as described by K. O. Hill and G. Meltz in *J. Lightwave Technol.* vol. 15, p 1263 (1997). The fiber Bragg grating couples light traveling in the fiber from one fiber mode to another, thus forming an optical transmission or reflection filter. The spacing of the index variation is of the order $\lambda/2$, where $\lambda$ is the wavelength of the light in the fiber. Fiber grating spectra can be tailored by the design of the refractive index pattern used in its formation as described by T. Erdogan in *J. Lightwave Technol.* vol. 15, p 1277 (1997).

Relevant to the present invention, fiber grating spectra can be made to have sharp transitions between ~0% and ~100% transmission as a function of optical frequency with various slopes. The edge of transmission or reflection band of a fiber Bragg grating thus forms our optical frequency or phase discriminator. Also the spectrum of the fiber grating can be made insensitive to temperature variations by attaching it to a support member having a negative coefficient of thermal expansion as described in U.S. Pat. No. 5,694,503.

It is well known that the optical output of a gain-modulated semiconductor optical device is also phase modulated. Our invention takes advantage of the fact that the accompanying phase modulation is correlated with the intensity modulation, and that it is large. The magnitude and sign of this correlation is given by the linewidth enhancement factor, $\alpha$, as described by C. H. Henry, *IEEE J. Quantum Electron.* QE-18, p259 (1982). Here we define $\alpha$ to be positive if the refractive index of the optical device increases with increasing gain. With this definition, $\alpha<0$ for semiconductor lasers and semiconductor optical amplifiers. For other devices such as Mach-Zehnder interferometer with SOAs in the two arms, $\alpha$ is replaced by the chirp parameter, which is measured in a similar way.

Using an optical discriminator with a steep slope such as a fiber Bragg grating filter, we convert the phase modulated response to "useful" intensity modulation to enhance the high-frequency modulation response of the device. It is important to note that phase to amplitude conversion does not necessarily improve frequency response. In fact, conversion of phase modulation to intensity modulation can be a detriment in fiber optic transmission systems. A key element of the present invention is that it chooses the sign and magnitude of the slope of the optical discriminator such as to add the converted phase modulation component with the positive sign and weight to the intensity modulated component, flattening the frequency response.

Figure 7:
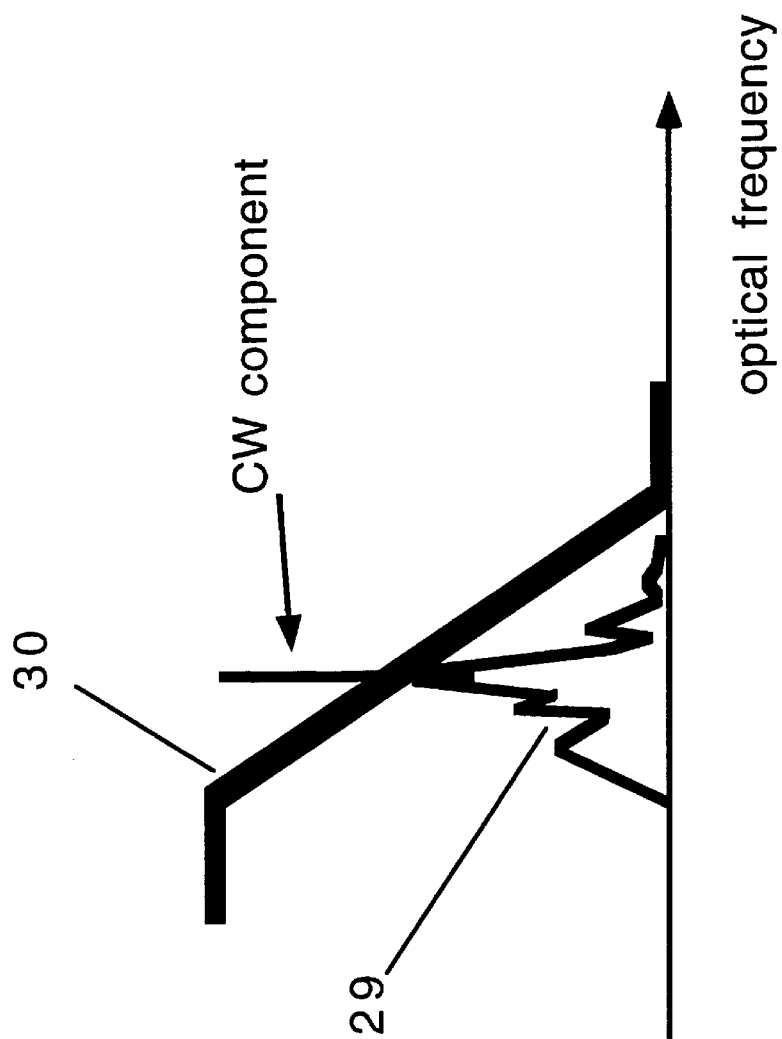
FIG. 7. Placement of wavelength converted spectrum relative to spectrum of discriminator for NRZ data.
Figure 11:
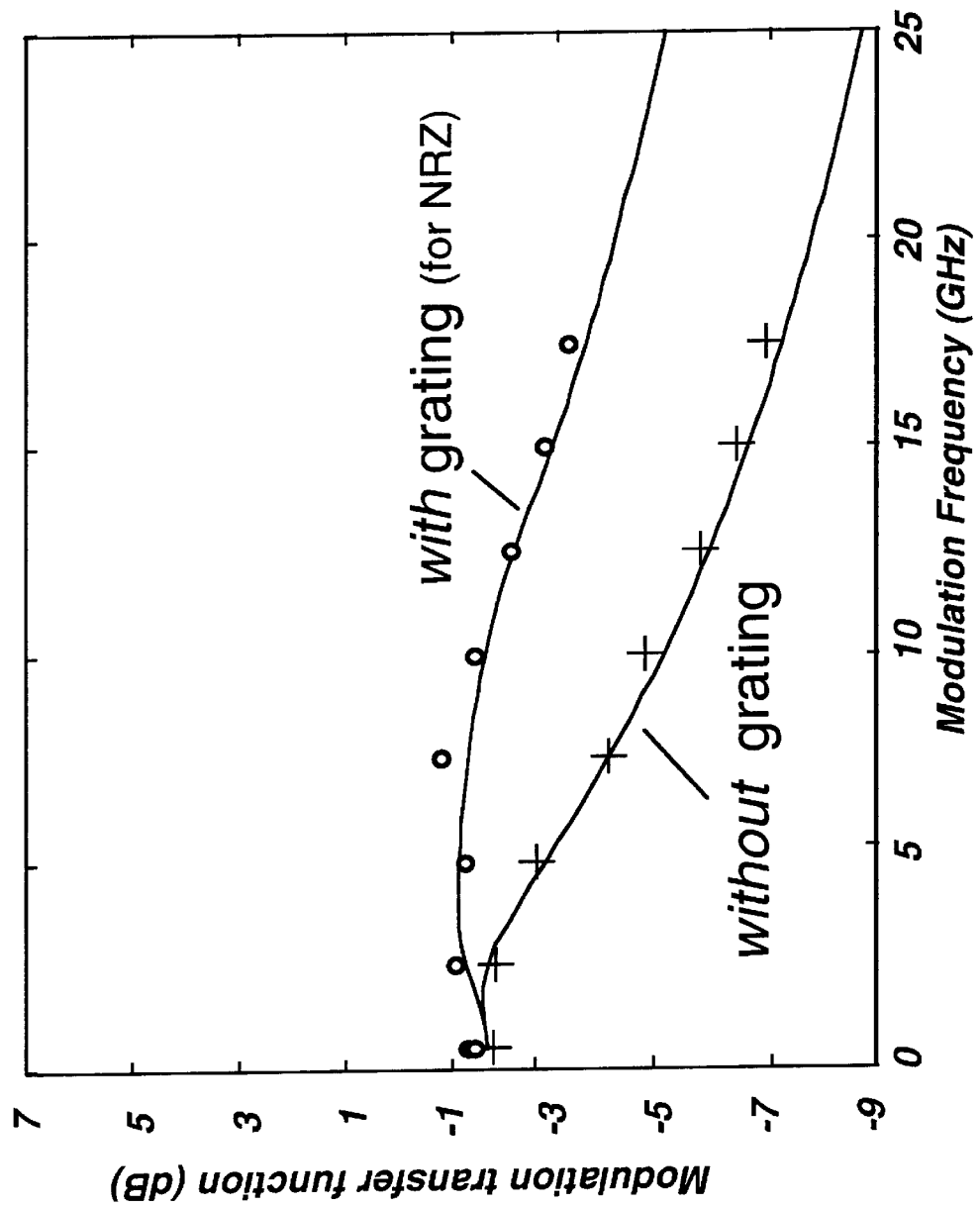
FIG. 11 Modulation transfer function of wavelength converter with and without fiber grating optical discriminator.

To achieve this, the wavelength-converted signal is to pass through the optical discriminator so as to place its spectrum 29 within the transition region of the filter's spectrum 30 as shown in FIG. 7. The sign of the slope, b, of the discriminator is to be chosen such that $b\alpha>0$. In this condition, the frequency discriminator adds the time derivative of the input electric field to itself with $\pi/2$ phase shift, sharpening the transitions between the intensity profile of the 1 and 0 bits. For NRZ data, the magnitude of the slope is to be chosen to be $\sim_{1/\alpha f}$, where $_f$ is the 3 dB roll-off frequency of the wavelength converter, which can be determined as described by T. Durhuus et al., *J. Lightwave Technology*, vol. 14, p. 942 (1996). Choosing the proper sign and slope produces a flattened modulation frequency response for the wavelength converter. FIG. 11 shows the modulation transfer function of a semiconductor optical amplifier wavelength converter without the fiber grating (crosses) and the modulation transfer function after the signal has passed through a fiber Bragg grating discriminator (circles) as described above. The marks are experimental data and the solid curve is theory, both showing the increased frequency response after the application of the fiber Bragg grating discriminator.

We applied this invention to wavelength conversion of NRZ data at 10 Gb/s and obtained error-free operation in an SOA converter with a roll-off frequency of 6 Hz. Error-free operation was not possible without the application of this invention as demonstrated in our enclosed article *IEEE Photon. Technol. Lett.* vol. 9, pp 1583–1585 (1997).

Figure 12:
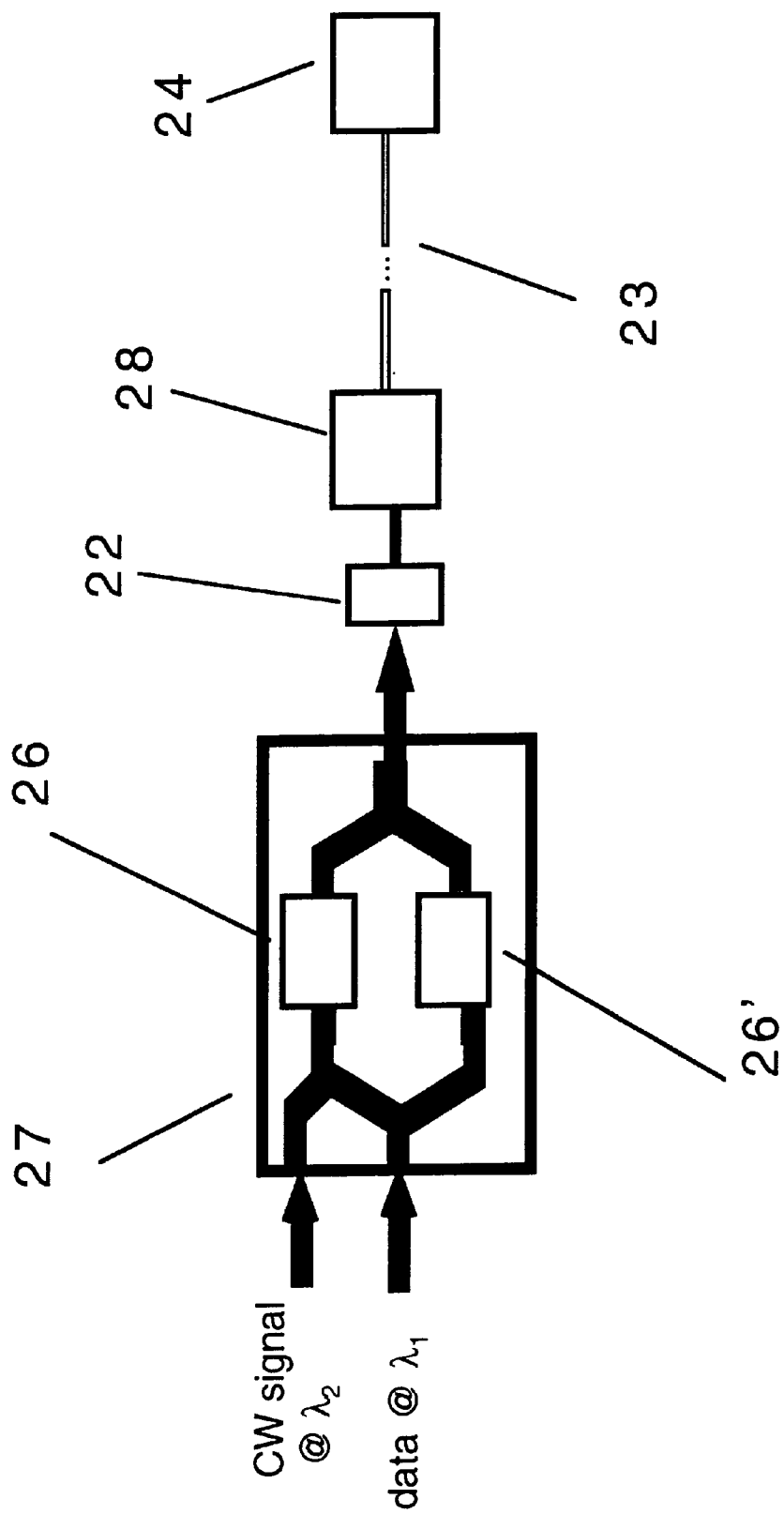
FIG. 12 Optical wavelength conversion system comprising Mach-Zehnder interferometer and optical discriminator.

It is understood that the same procedure applies to a interferometer wavelength converter shown in FIG. 12 with SOAs since the output of such a device also has phase modulation at the transitions between 1 bits and 0 bits. Since the sign of the effective α parameter for a Mach-Zehnder can he positive or negative, the slope of the fiber Bragg grating discriminator has to be chosen appropriately as described above.

Figure 8:
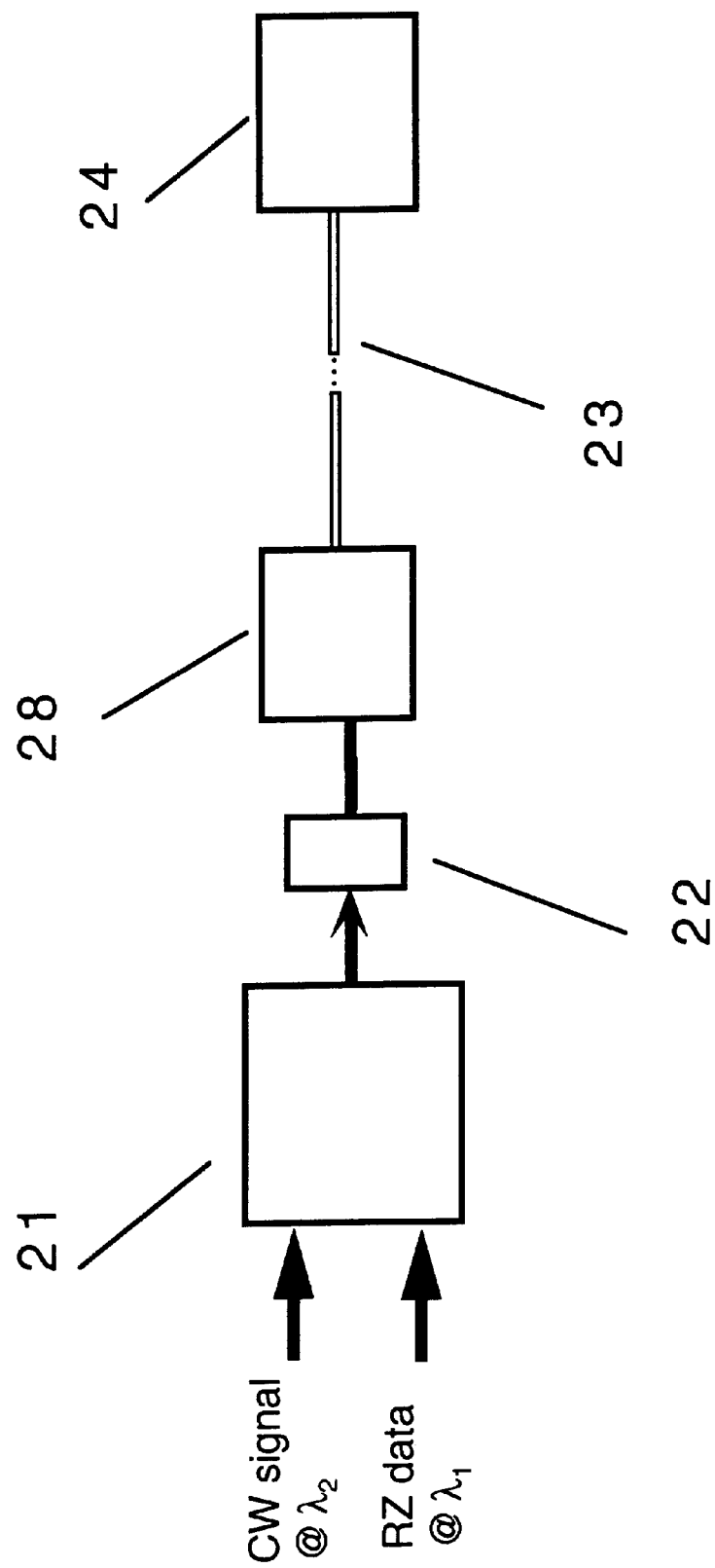
FIG. 8 Wavelength conversion system for RZ data comprising optical discriminator.
Figure 9:
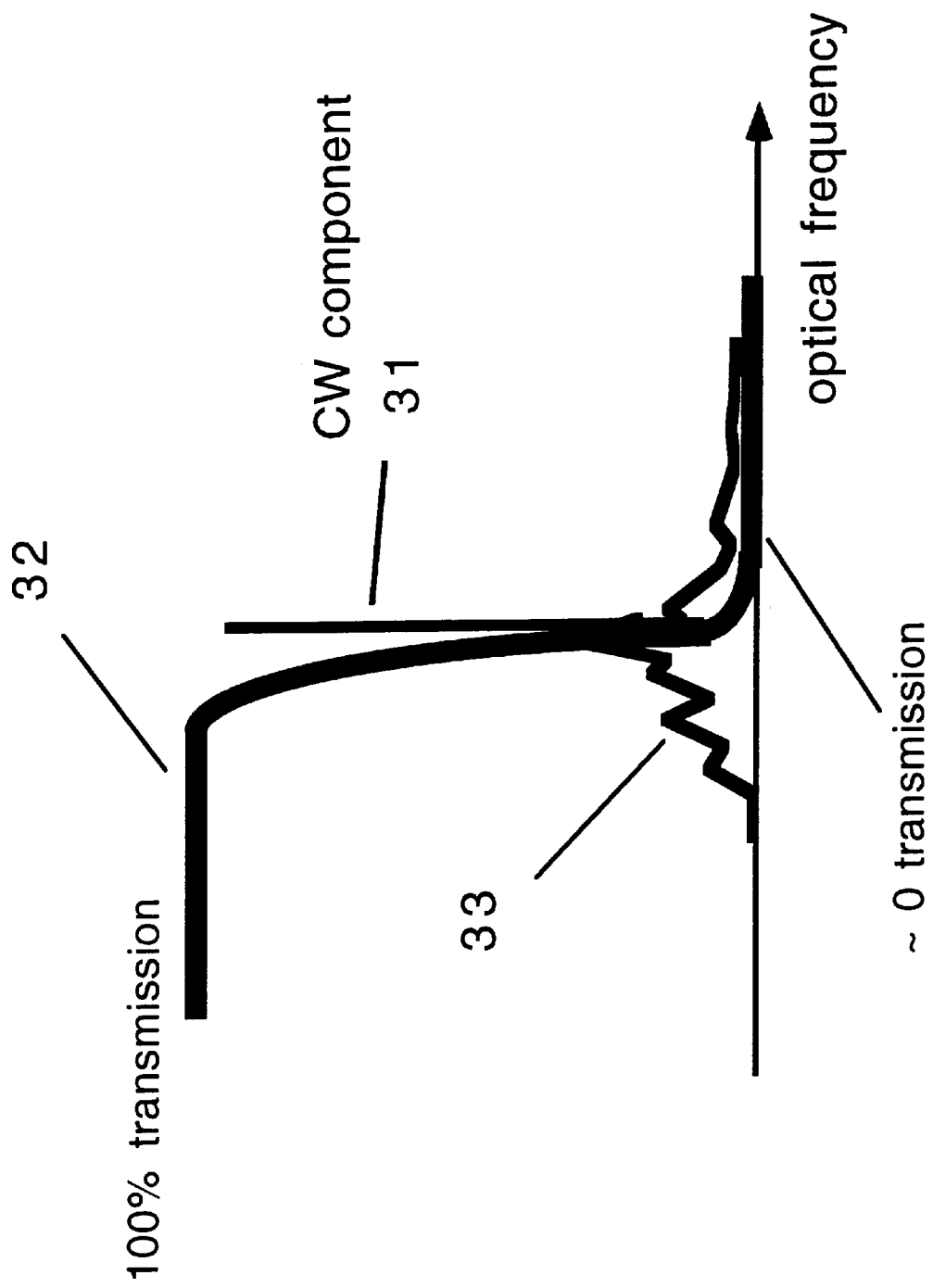
FIG. 9 Placement of wavelength converted spectrum relative to spectrum of discriminator for RZ data.

Another objective of the present invention is to increase the frequency response of a SOA wavelength converter for RZ data, to increase the extinction ratio of the converted RZ data, and to avoid inversion of data upon wavelength conversion. Our invention shown in FIG. 8 is to combine the RZ data at $\lambda_1$ and a CW signal at $\lambda_2$ in a SOA 21 after which signal $\lambda_2$ at the output of the SOA is passed through a fiber Bragg grating optical discriminator 28. The CW signal is intensity and phase modulated in the SOA by the presence of the RZ data pulses. The signal at $\lambda_2$ is to pass through the discriminator such as to block its CW component 31 and to place its red-shifted components 33 in the transition region of the fiber grating's spectrum 32 as shown in FIG. 9. For opposite sign of slope for the discriminator, the CW component is blocked and the blue-shifted components of the $\lambda_2$ are in the transition region of the fiber grating's spectrum with similar results. In this configuration the modulation transfer function of the SOA is increased significantly as shown in our enclosed paper ThB3 in *Digest of Lasers and Electro-Optics Society Summer Topical Meetings* (1997).

Figure 13:
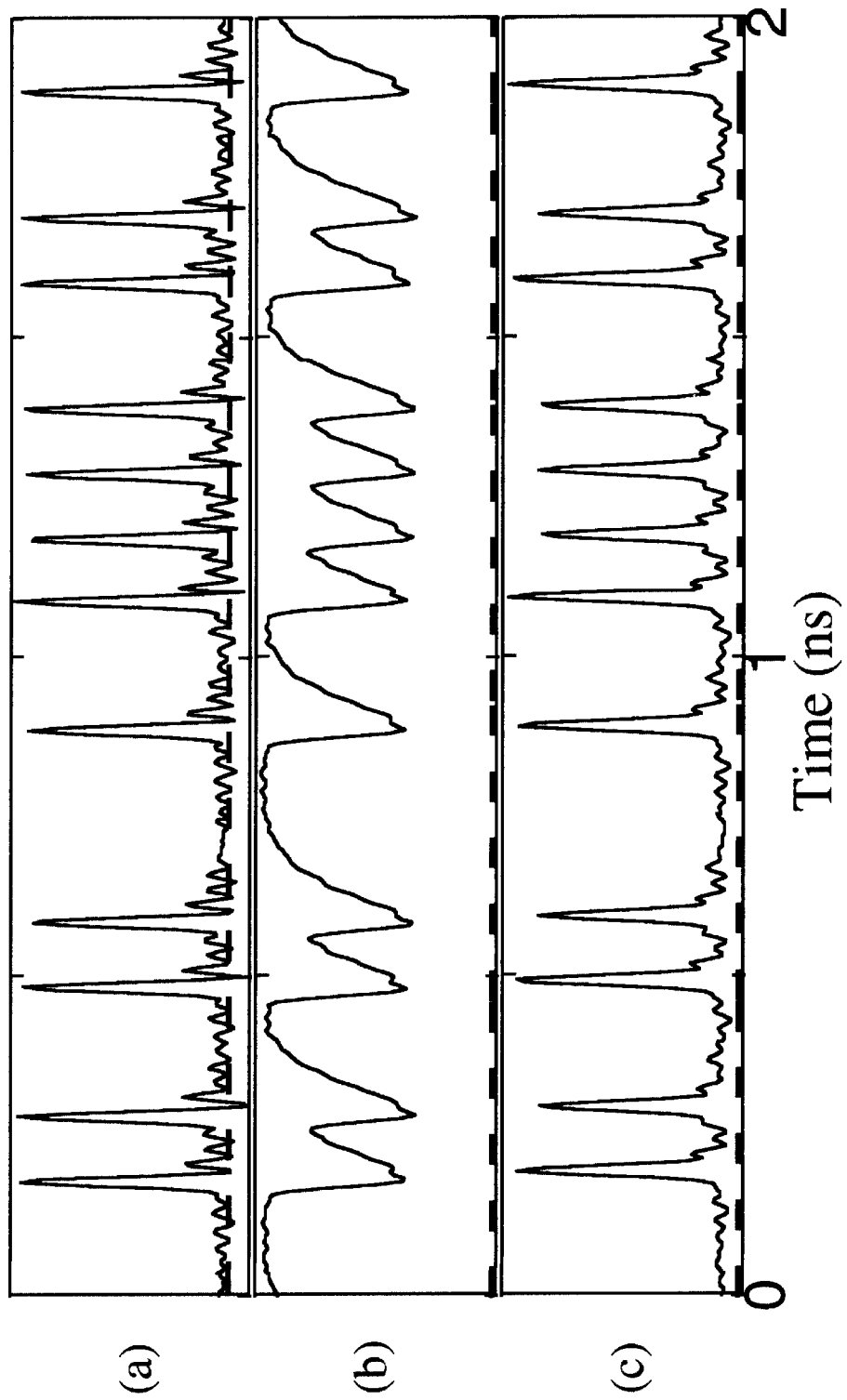
FIG. 13 Optical wavelength conversion of RZ data with and without use of a fiber Bragg grating discriminator.

In the same configuration, the extinction ratio, defined for RZ data as the ratio of the 1 bits to the 0 bits improved by a factor of 10 with the presence of the fiber grating as shown in FIG. 13, where (a) is the RZ data at $\lambda_1$=1546 nm, (b) is the converted data without a fiber Bragg grating discriminator, and (c) is the wavelength converted RZ signal at $\lambda_2$=1535.3 nm after the fiber Bragg grating. The dashed lines in FIG. 13 represent zero levels. The RZ data was at 10 Gb/s. In addition wavelength conversion of RZ pulses using this invention produces non-inverted pulses. Application of the fiber Bragg grating discriminator in the mangler described above produced a 10 dB reduction in conversion penalty at 10 Gb/s as described in our enclosed paper *Electron. Lett.* vol. 34, pp. 371–373 (1998).

Figure 14:
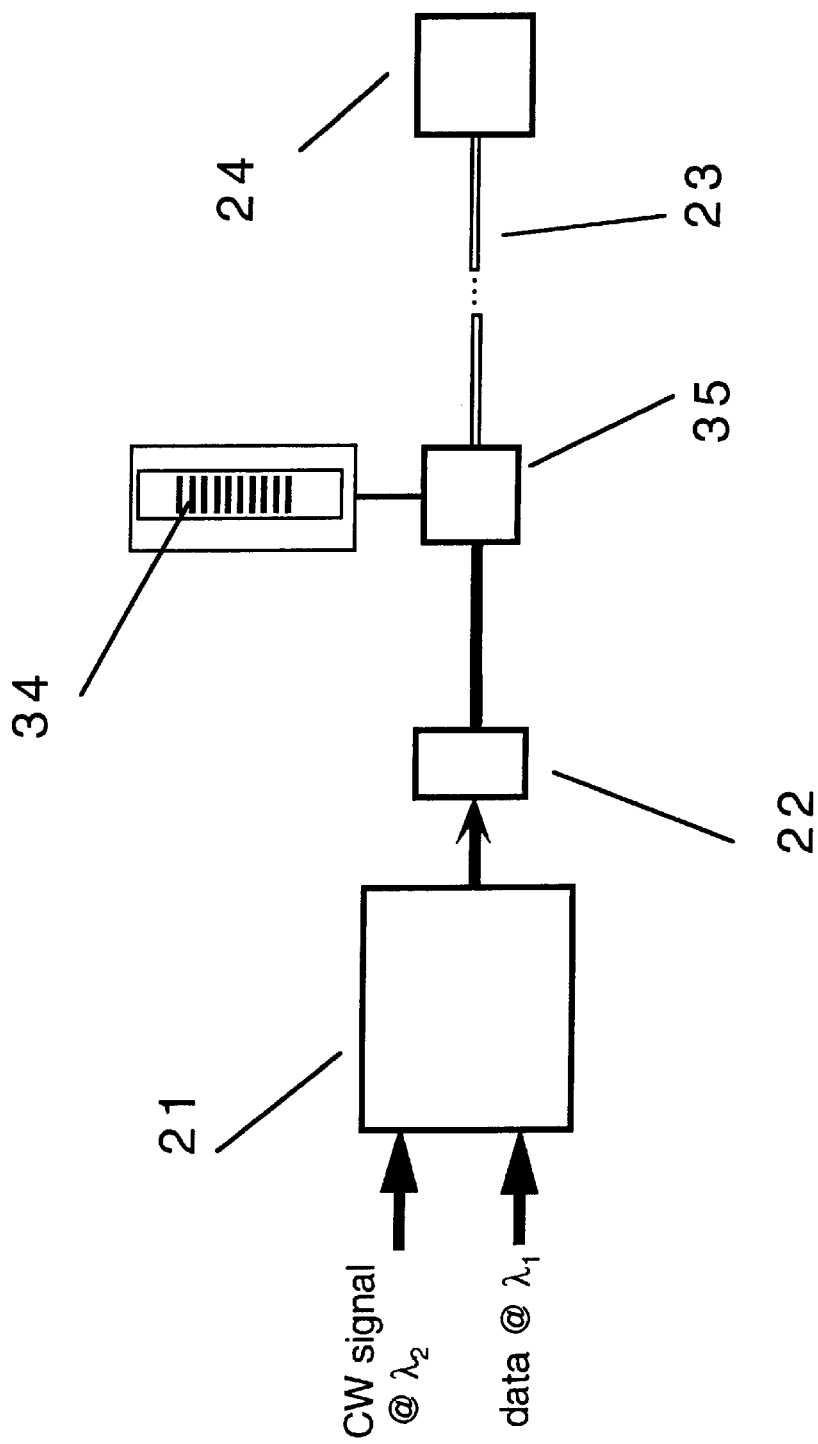
FIG. 14 Optical wavelength conversion system comprising fiber Bragg grating discriminator in reflection mode.

It is understood that a fiber Bragg grating 34 can also form a discriminator in reflection as shown in FIG. 14 in which case a circulator 35 with a reflection port is used after the SOA 21 to select the reflected signal.

Figure 15:
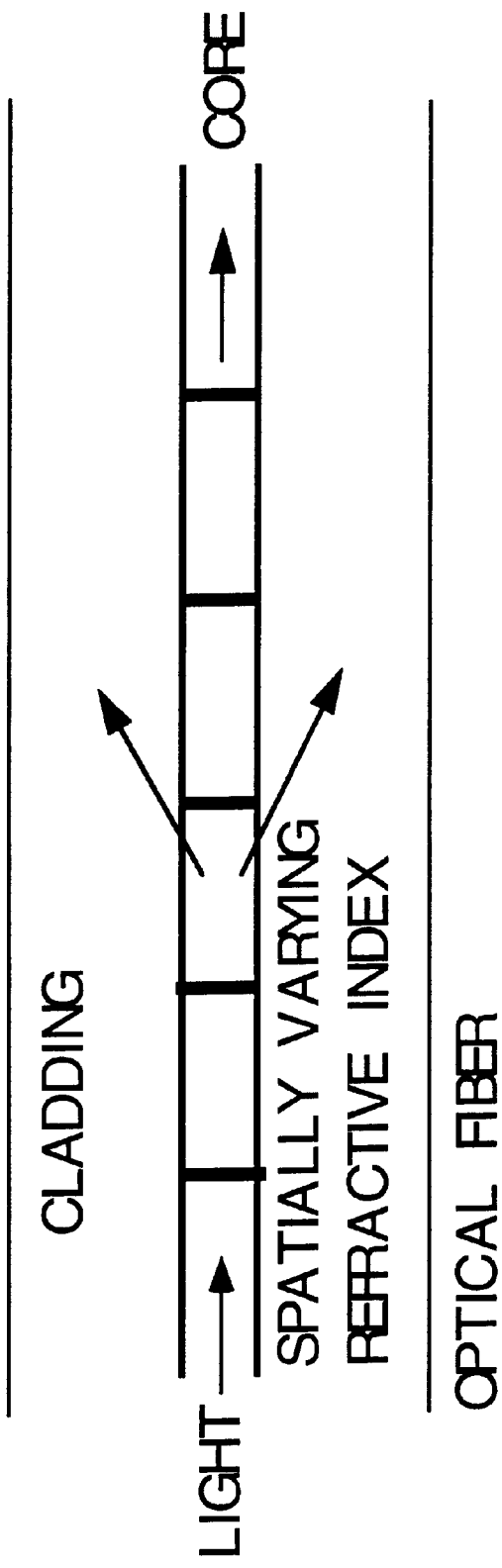
FIG. 15 Graphical representation of a long-period fiber grating discriminator.

An optical discriminator can also be formed from a fiber grating that couples light from the core mode to the cladding modes. A long-period fiber grating, schematically shown in FIG. 15, and discussed by K. O. Hill and G. Meltz in *J. Lightwave Technol*. vol. 15, p 1263 (1997) is one embodiment of such a discriminator. Also the spectrum of the long-period grating can be made insensitive to temperature variations by proper design of fiber composition and index profile as described in U.S. Pat. No. 5,703,978.

Other embodiments of an optical discriminator for the purposes of this invention are Fabry-Perot filters made of fiber or semiconductor material, a dynamic grating formed in a nonlinear optical material such as a photorefractive material acting as a Bragg reflector, a refractive index grating formed in a semiconductor or glass waveguide, and a ring resonator filter. These form transmission filters with spectra that have transition regions with a slope. The converted signal is passed through the filter, which is placed after the SOA as shown in FIGS. 6 and 8. The filter is tuned such that the signal spectrum is on the slope of the said filter similar to FIG. 7 and FIG. 9 for NRZ and RZ data formats, respectively. The sign and magnitude of the slope has to be chosen as described above.

What is claimed is:

1. A wavelength converter using a semiconductor optical amplifier, comprising a continuous wave tunable laser of a first wavelength, an optical data of a second wavelength a semiconductor optical amplifier (SOA) to which said first wavelength and said second wavelength are combined to produced an intensity- and phase-modulated signal of said first wavelength, and an optical discriminator to convert said intensity- and phase-modulated signal to an enhanced intensity-modulated signal in such a way as to decrease the apparent response time of the SOA and to remove pattern dependence.

2. A wavelength converter as described in claim 1, wherein said optical discriminator is a fiber Bragg grating optical discriminator.

3. A wavelength converter as described in claim 2, wherein said discriminator operates in the transition region with a slope so as to the sharpen the transitions between the intensity profile of "1" and "0" bits of any digital data.

4. A wavelength converter as described in claim 3, wherein said slope is positive.

5. A wavelength converter as described in claim 3, wherein said slope is negative.

6. A wavelength converter as described in claim 3, wherein said data is of return-to-zero type.

7. A wavelength converter as described in claim 6, wherein said discriminator is operating at the corner of the slope of the characteristic of said optical filter for return-to-zero input data.

8. A wavelength converter as described in claim 2, wherein said fiber Bragg grating discriminator operates in reflection mode having a circulator with a reflection port to select the signal reflected by the discriminator.

9. A wavelength converter as described in claim 1, wherein said optical discriminator is a Fabry-Perot filter.

10. A wavelength converter as described in claim 1, wherein said optical discriminator is a photorefractive grating formed in a nonlinear optical material.

11. A wavelength converter as described in claim 1, wherein said optical discriminator is a ring resonator filter.

12. A wavelength converter as described in claim 1, wherein said optical discriminator is a refractive index grating formed on a semiconductor material.

13. A wavelength converter as described in claim 1, wherein said optical discriminator is a refractive index grating formed on a planar glass waveguide.

14. A wavelength converter as described in claim 1 wherein said optical data are binary digital data.

15. A wavelength converter as described in claim 1, wherein the wavelength of said intensity- and phase modulated signal lies in a transition region of the transmission spectrum of the discriminator.

16. A wavelength converter as described in claim 1, wherein said data are non-return-to-zero data.

17. A wavelength converter as described in claim 1, wherein a fiber grating discriminator is formed from a long-period fiber grating, in which light couples from a core mode to a cladding mode.

18. A method for increasing the modulation response in a semiconductor optical amplifier wavelength converter coupled to a phase discriminator, comprising the steps of:

generating a continuous wave (CW) signal of first wavelength;

inputting a digital data of a second wavelength;

modulating said CW signal with said digital data as an intensity and phase-modulated signal;

detecting said phase-modulated signal using a fiber grating optical discriminator to convert said intensity and phase modulated signal into an amplitude-modulated signal; and feeding said amplitude-modulated signal to an optical receiver.

19. A method for increasing the modulation response as described in claim 18, wherein said discriminator is a slope detector, operating at the transition region of the frequency spectrum of the discriminator.

20. A method for increasing the modulation response as described in claim 19, wherein said optical discriminator is a fiber Bragg grating discriminator.

21. A method for increasing the modulation response as described in claim 20, wherein said fiber Bragg grating discriminator is operating in a transmission mode.

22. A method for increasing the modulation response as described in claim 20, wherein said fiber Bragg grating discriminator is operating in a reflection mode.

23. A method for increasing the modulation response as described in claim 18, wherein the fiber grating optical discriminator is operating in a cladding mode.

* * * * *